United States Patent [19]

Kuo

[11] Patent Number: 4,763,305

[45] Date of Patent: Aug. 9, 1988

[54] INTELLIGENT WRITE IN AN EEPROM WITH DATA AND ERASE CHECK

[75] Inventor: Clinton Kuo, Austin, Tex.

[73] Assignee: Motorola, Inc., Schaumburg, Ill.

[21] Appl. No.: 802,299

[22] Filed: Nov. 27, 1985

[51] Int. Cl.$^4$ .................. G11C 11/34; G11C 29/00

[52] U.S. Cl. ............................ 365/200; 365/218; 365/201

[58] Field of Search .............. 365/104, 218, 201, 200; 371/21

[56] References Cited

U.S. PATENT DOCUMENTS

| | | | |
|---|---|---|---|
| 4,203,158 | 5/1980 | Frohmann-Bentchkowsky et al. | 365/185 |
| 4,266,283 | 5/1981 | Perlegos et al. | 365/104 |
| 4,366,555 | 12/1982 | Hu | 365/104 X |
| 4,460,982 | 7/1984 | Gee et al. | 365/104 X |
| 4,489,404 | 12/1984 | Yasuoka | 365/218 X |
| 4,578,751 | 3/1986 | Erwin | 365/218 X |

OTHER PUBLICATIONS

Gee et al., "An Enhanced 16K EEPROM", IEEE Journal of Solid State Circuits, vol. SC-17, No. 5, Oct. 1982, pp. 828-832.

Primary Examiner—Stuart N. Hecker
Assistant Examiner—Alyssa H. Bowler
Attorney, Agent, or Firm—John A. Fisher; Jeffrey Van Myers; James L. Clingan, Jr.

[57] ABSTRACT

A memory provides a byte program mode which avoids unnecessary erase and program cycles. If a byte is to be programmed, the new data to be written is first compared to the existing data in the byte. If the old data is the same as the new data, there is no need to do a conventional erase/program cycle. In such case the memory does not perform the erase and reprogram which saves much time and avoids decreasing the life of the floating gate transistors in the byte. Even if the old data is not the same as the new data, the byte may already be in the erased state. In such case the erase cycle is skipped and programming is begun.

5 Claims, 3 Drawing Sheets

| LOGIC SIGNAL | CYCLE | | | | | |
|---|---|---|---|---|---|---|
| | BEGINNING PROGRAM CHECK | ERASE CHECK | ERASE | ERASE CHECK | PROGRAM | POST-PROGRAM PROGRAM CHECK |
| IR | H | H | L | H | L | H |
| PC | H | L | L | L | H | H |
| EC | H | H | H | H | L | L |
| ACP | L | L | L | L | H | L |
| CC | H | H | L | H | L | H |

INTELLIGENT WRITE IN AN EEPROM WITH DATA AND ERASE CHECK

FIELD OF THE INVENTION

The present invention relates to non-volatile memories, and more particularly to techniques for writing data into memory cells in a non-volatile memory.

BACKGROUND OF THE INVENTION

In programmable non-volatile memories which have a floating gate, and particularly which have electrical erase capability, there is a limit to the number of program and erase cycles that can be run. Electrically erasable non-volatile memories are generally known as electrically erasable programmable read only memories (EEPROMs). With each program or erase cycle, electrons are passed through the dielectric which insulates the floating gate and thus makes it "floating" in the electrical sense. Each program cycle as well as each erase cycle puts a stress on the dielectric which is used to insulate the floating gate. Each time a byte in the memory is to be programmed it must first be in the erased state. Consequently, for each time a byte is programmed, at least some of the bits will be both erased and programmed. This number of cycles is the endurance of the device. After some number of cycles the dielectric around the floating gate becomes leaky. After that the floating gate is not effective in retaining charge so that the memory cell so effected cannot effectively be programmed. This characteristic is known as the endurance of the memory. It is obviously desirable to have high endurance.

Another aspect of programming of EEPROMs is that it is quite time consuming in comparison to other memory types. In random access memories for example the time to perform a write is about the same as the time required to perform a read. In the case of EEPROMs, a typical read time might be 100 nanoseconds (ns), whereas a typical write time (erase time plus program time) might be 3 milliseconds (ms). This is over four orders of magnitude longer to write than to read. The 3 ms write time is required for each byte that is to be programmed. Consequently, the write time becomes even greater if a large number of bytes are to be programmed. Included in the time to write is the time to erase and to program. The rate of programming or erasure is determined by the rate at which electrons can either charge or discharge the floating gate by tunneling through the dielectric around the floating gate. This rate is limited by the device characteristics. Consequently, improvement in the device characteristics appears to be the source for improving program time. A circuit improvement, however, can be implemented without requiring an improvement in the process or device technology.

SUMMARY OF THE INVENTION

An object of the present invention is to provide an improved programming technique for an electrically erasable programmmable read only memory (EEPROM).

Another object of the invention is to provide an EEPROM with improved endurance.

Yet another object of the invention is to provide an EEPROM with reduced programming time.

DESCRIPTION OF THE INVENTION

Figure 1:
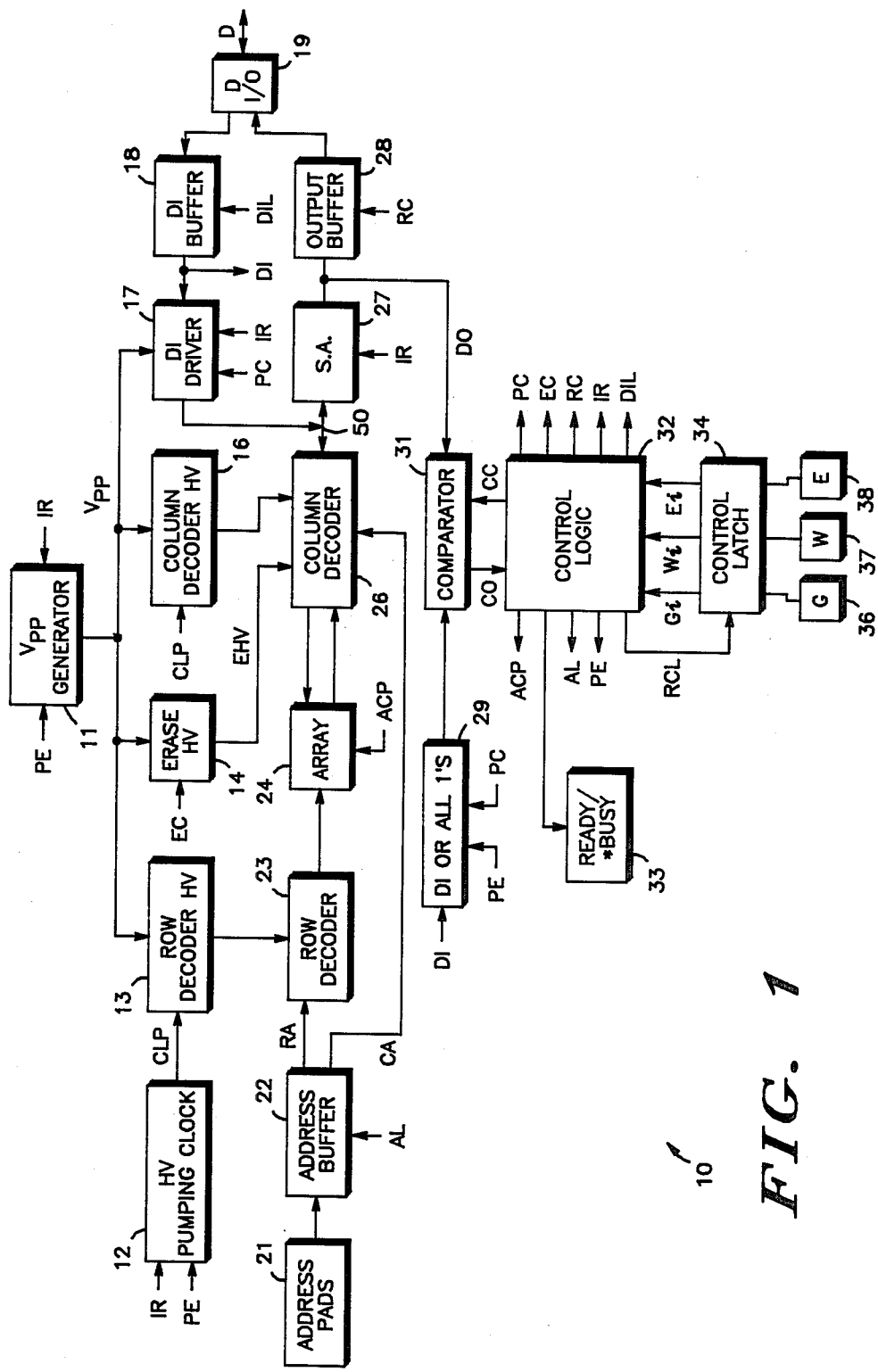
FIG. 1 is a combination block diagram and circuit diagram of an electrically erasable programmable read only memory according to a preferred embodiment of the invention.

Shown in FIG. 1 is an electrically erasable programmable read only memory (EEPROM) 10 comprised generally of a high voltage (Vpp) generator 11, a high voltage pumping clock 12, a row decoder high voltage generator 13, an erase high voltage generator 14, a column decoder high voltage generator 16, a data in driver 17, a data in buffer 18, data input/output (I/O) pads 19, address pads 21, an address buffer 22, a row decoder 23, a memory array 24, a column decoder 26, a sense amplifier 27, an output buffer 28, a data in or all ones switch 29, a comparator 31, a control logic circuit 32, a READY/*BUSY pad 33, a control latch 34, a control signal pad 36, a control signal pad 37, and a control signal pad 38.

Generator 11 generates a high voltage Vpp for programming or erasing data in array 24. High voltage Vpp is generated at about 20 volts when a program/erase signal PE is a logic high and an intelligent read signal IR is a logic low. Signal PE at a logic high indicates that memory 10 is in an erase mode or a program mode. There are three erase modes and two program modes. There is an array erase mode, a page erase mode, and a byte erase mode. In the array erase mode, all of array 24 is erased to the logic high state. In the byte erase mode, one selected byte (8 bits) is erased to the logic high state. There is a byte program mode and a bulk zero mode. In the byte program mode, predetermined bits in a selected byte are programmed to the logic low state. In the bulk zero mode, all of array 24 is programmed to the logic low state. These four states are known in the art. For more details concerning these modes of operation see U.S. Pat. No. 4,412,309, Kuo, entitled "EEPROM With Bulk Zero Program" capability, issued Oct. 25, 1983.

High voltage Vpp is received by high voltage generators 13, 14, and 16 and by driver 17. Row decoder high voltage generator 13 has an output connected to row decoder 23. Generator 13 also has an input for receiving a clock pump signal CLP. Column decoder high voltage generator 16 also has an input for receiving clock pump signal CLP and an output connected to column decoder 26. Erase high voltage generator 14 has an output connected to column decoder 26 and an input for receiving erase control signal EC. Generator 14 couples Vpp to array 24 via column decoder 26 when signal EC is a logic high. When signal EC is a logic low, generator 11 supplies ground to column decoder 26. Pumping clock 12 provides clock signal CLP when signal PE is a logic high and signal IR is a logic low. Clock CLP is supplied concurrently with Vpp being supplied at a high voltage.

Array 24 is comprised of a large number of EEPROM memory cells which are arranged in bytes. Each byte is connected to a set of 8 bit lines, one bit line for each bit in the byte. Each byte is connected to a word line which runs perpendicular to the bit lines. There is also an erase line for each byte which runs parallel to the bit lines. For each erase line and set of bit lines, there is connected thereto many bytes. Likewise there are many bytes connected to each word line. A byte is accessed when the word line connected thereto is enabled and the bit lines coupled thereto are coupled to sense amplifier 27 via column decoder 26. Address pads 21 receive a row address RA and a column address CA. The row address determines the word line which is selected to be enabled. The column address determines which set of bit lines is coupled to sense amplifier 27 or data in driver 17. Address buffer 22 receives the address and latches the received address in response to an address latch signal AL switching to a logic high. Address buffer 22 provides row address RA to row decoder 23 and column address CA to column decoder 26. Row decoder 23 enables the word line which is selected by row address RA. Column decoder 26 couples the set of bit lines selected by address CA to a data line 50 which is used to output data to sense amplifier 27 or to receive data to be written from data in driver 17. Column decoder 26 is coupled to data in driver 17 and sense amplifier 27 via data line 50. Data in driver 17 receives data in signals from data in buffer 18 which in turn receives them from data I/O pad 19. (Buffer 18 latches the data in signals DI in response to signal DIL switching to a logic high. Driver 17 has an input connected to Vpp in order to provide signal DI at the required programming levels to array 24 via column decoder 26. Sense amplifier 27, when intelligent read signal IR is a logic high, senses the data provided to data line 50 by array 24 via column decoder 26. Sense amplifier 27, in response to sensing data, provides output signal DO to output buffer 28 an comparator 31. Output buffer 28, when a signal RC is received thereby at a logic high, provides signal DO from sense amplifier 27 to pad 19. Signal RC at a logic high is indicative of memory 10 being in a read mode.

Control latch 34 receives mode control signals G, W, and E from pads 36, 37, and 38, respectively. A code for signals G, W, and E has been devised for indicating which of the modes of memory 10 is to be entered. This coding is known in the art. For more details in this regard see U.S. Pat. No. 4,412,309, Kuo, entitled "EEPROM With Bulk Zero Program Capability", issued Oct. 25, 1983. Control latch 34 provides internal control signals Gi, Wi, and Ei to logic 32 according to the logic state of signals G, W, and E. Control logic circuit 32 receives and interprets signals Gi, Wi, and Ei. When logic 32 interprets the logic states of signals Gi, Wi, and Ei as a byte write mode request, logic 32 switches signal RCL to a logic low causing latch 34 to latch signals G, W, and E. Control logic 32, comprised of conventional logic gates and timers, provides a signal READY/*BUSY to pad 33 at a logic high to indicate that memory 10 is ready to respond to a command from signals G, W, and E. When memory 10 is in a mode in which signals G, W, and E are latched, and/or the address latched, control logic 32 generates signal READY/*BUSY at a logic low. At the termination of such a mode, control logic 32 switches signal READY/*BUSY to a logic high.

Figures 2, 3:
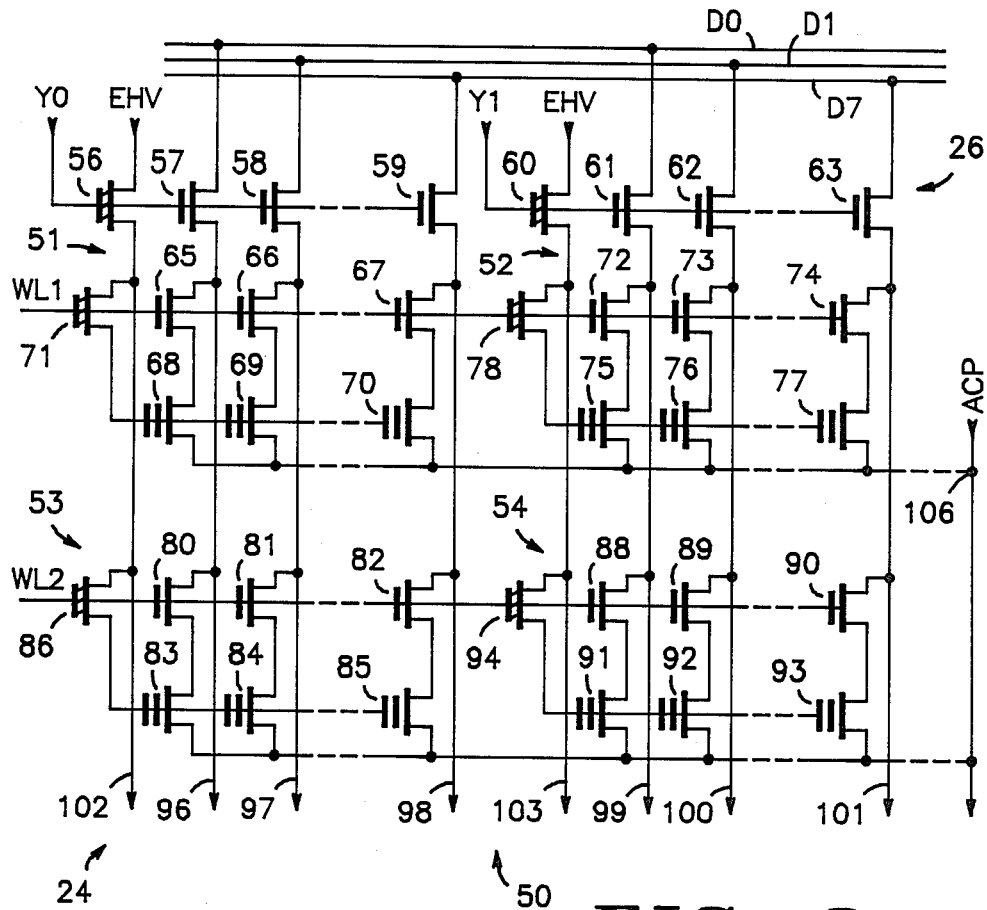
FIG. 2 is a circuit diagram of a portion of an array portion of memory 10 which is known in the art but is helpful in understanding the invention.
FIG. 3 is a table of logic signals used in implementing the preferred embodiment of the invention.

Portions of array 24, column decoder 26 and data line 50 are shown in FIG. 2. Shown in FIG. 2 are portions of four bytes 51, 52, 53, and 54 of array 24. Three data lines D0, D1, and D7 are shown in FIG. 2 for data line 50. Data line 50 comprises 8 different individual data lines in order to carry a full byte of data. In FIG. 2 column decoder 26 has transistors 56–63. As shown in FIG. 2, bytes 51–54 each have three coupling transistors, three floating gate transistors, and one control transistor, whereas each byte actually has 5 more floating gate transistors and 5 more coupling transistors. Bytes 51–54 are described herein with respect to the transistors shown in FIG. 2. Byte 51 comprises coupling transistors 65, 66, and 67; floating gate transistors 68, 69, 70; and control transistor 71. Byte 52 comprises coupling transistors 72, 73, and 74; floating gate transistors 75, 76, and 77, and control transistor 78. Byte 53 comprises coupling transistors 80, 81, and 82; floating gate transistors 83, 84, and 85; and control transistor 86. Byte 54 comprises coupling transistors 88, 89, and 90; floating gate transistors 91, 92, and 93; and control transistor 94. Array 24 is shown in FIG. 2 as including bit lines 96, 97, 98, 99, 100, and 101; erase lines 102 and 103; and word lines WL1 and WL2. Bytes 51 and 53 are connected to bit lines 96–98 and erase line 102, and bytes 52 and 54 are connected to bit lines 99–101 and erase line 103. Word line WL1 is connected to bytes 51 and 52. Word line WL2 is connected to bytes 53 and 54. All of the sources of floating gate transistors 68–70, 75–77, 83–85, and 91–93 are connected to a node 106 which is controlled by an array control program signal ACP. Signal ACP is at ground during a read or erase cycle and at a voltage near the voltage at a power supply terminal VDD which receives the power supply voltage during a program cycle. The power supply voltage can be, for example, 5 volts.

When a word line is enabled, the control transistor of each byte connected to the enabled word line couples the erase line to the gates of the floating gate transistors of that byte. Column decoder erase transistors 56 and 60 receive signals Y0 and Y1, respectively. Transistors 56 and 60 are depletion transistors so that they will conduct signal EHV to erase lines 102 and 103, respectively, for small voltages of EHV even when signals Y0 and Y1 are a logic low. Consequently, the erase lines such as lines 102 and 103 are a logic low when signal EHV is a logic low. Signal EHV is a logic low except when an erase is to be performed. In the program and read modes, signal EHV is at ground. Control transistors 71, 78, 86, and 94 are also depletion transistors. Consequently, the erase line voltage is coupled to the gates of all of the floating gate transistors for low voltages of the erase lines. All of the erase lines are a logic low except when signal EHV is at the high voltage of about 20 volts. For read and program modes, the gates of the floating gate transistors are grounded.

A byte is read by enabling the word line to which the byte is connected and coupling the bit lines to which the byte is connected to data line 50. To select byte 54, word line WL2 is enable by switching it to a logic high. This causes coupling transistors 88–90 to couple the drains of floating gate transistors 91–93 to bit lines 99–101, respectively. Bit lines 99, 100, and 101 are coupled to data lines D0, D1, and D7, respectively, in response to signal Y1 switching to a logic high. Floating gate transistors 91–93 are thus coupled to data line 50 where the conductivity state of the floating gate transistors can be sensed by sense amplifier 27. Floating gate transistors are in either a high or low threshold voltage state. The high threshold state causes a floating gate transistor to be non-conductive. The threshold voltage of a floating gate transistor in the high threshold state is around 5 volts which is well above ground which is the voltage on the gate of the floating gate transistor. The threshold voltage of a floating gate transistor in the low threshold state is about −5 volts. Consequently, a floating gate transistor in the low threshold state is conductive. The enabling of word line WL2 and the switching of signal Y1 to a logic high selects byte 54 for reading.

To program byte 54, however, requires higher voltages than to read byte 54. To program a floating gate transistor, a high voltage is applied to the drain while the gate and source are grounded. Byte 54 is programmed by enabling word line WL2 with a high voltage while providing signal Y1 at high voltage. The actual programming is achieved by application of the high voltage to the drain of the floating gate transistor to be programmed. Not all of the floating gate transistors of a selected byte are likely to be programmed. Before programming occurs, all of the floating gate transistors of the selected byte must first be in the erased state. The erased state is the high threshold state and is read as a logic high. Only the floating gate transistors which are to be a logic low are programmed. The floating gate transistors which are to remain in the logic high state are not programmed. The floating gate transistors which are to remain in the logic high state receive ground while the floating gate transistors which are to be programmed receive the high voltage. Such high voltage is coupled to the particular floating gate transistor from data line 50 via the column decoder transistors and the coupling transistors of the byte. If floating gate transistor 92 is to be programmed, data line D1 is brought to a high voltage by data in driver 17 shown in FIG. 1. In order for the high voltage on data line D1 to reach floating gate 92, column decoder transistor 62 and coupling transistor 73 must receive a sufficiently high gate voltage to pass the high voltage to floating gate transistor 92. Thus for programming a byte, the row decoder, which drives the word line, and the column decoder must receive a high voltage. Row decoder 23 enables the selected word line. The required high voltage is supplied by row decoder high voltage generator 13. The high voltage required by column decoder 26 is supplied by column decoder high voltage generator 16.

High voltage is also required for erase. To erase a floating gate transistor, high voltage is applied to the control gate while the source and drain are coupled to ground. Byte 94 is selected to be erased in the same way as it is selected to be programmed. The differences are that data line 50 is grounded, signal EHV is at the high voltage of about 20 volts, and signal ACP brings node 106 to ground. Signal Y1 must be at the high voltage in order to adequately couple the high voltage of signal EHV to erase line 103. Word line WL2 must be at the high high voltage in order to adequately couple the high voltage on erase line 103 to the gates of floating gate transistors 91-93. With word line WL2, signal EHV, and signal Y1 at the high voltage, and data line 50 and signal ACP at ground, byte 54 is erased so that floating gate transistors 91-93 are in the high threshold state which is interpreted to be a logic high.

In order to program a byte in an array such as array 24, the byte must first be in an erased state. Consequently, in the past a byte erase would precede a byte program. Memory 10 provides for erasing only when necessary. If a byte is to be programmed, it is possible that the byte to be programmed is already programmed to the desired state. This is particularly true in the case of updating a large portion of memory. Assume for example that one thousand bytes controlled a certain function for a user. The user may update this function which requires reprogramming the one thousand bytes. In reality perhaps only 5 percent of the bytes were changed which means only 50 bytes need to be programmed again. The user, however, may not have a convenient technique for keeping track of which locations are the ones which are to be changed. The reprogramming may be automatic under processor control. In such case the entire one thousand bytes are reprogrammed even though the actual content change is to only 50 bytes. This means that 950 bytes are unnecessarily erased and programmed. This is a waste of time and also subtracts one more erase/program cycle from the life of the particular bytes which are unnecessarily erased and programmed.

Memory 10 provides a technique which avoids this unnecessary erase and program. If a byte is to be programmed, the new data to be written is first compared to the existing data in the byte. If the old data is the same as the new data, there is no need to do the conventional erase/program cycle. In such case memory 10 does not perform the erase and reprogram which saves much time and avoids decreasing the life of the floating gate transistors in the byte. Even if the old data is not the same as the new data, the byte may already be in the erased state. In such case the erase cycle is skipped and programming is begun. This saves the time normally required to perform a byte erase.

When memory 10 is instructed to erase a byte, the address determines which byte is to be programmed and signals G, W, and E define the byte write mode. Control logic 32, coupled to latch 34, receives signals Gi, Wi, and Ei and interprets these signals. When logic 32 determines that the byte program mode has been requested, logic 32 switches signal RCL, signal AL, and signal DIL to a logic high to latch the control signals, the address, and the data in, respectively, and switches signal READY to a logic low to indicate to a user that memory 10 is busy and will not respond to new control signals, a new address, or new data in. After signal DIL has switched to a logic high, buffer 28 provides signal DI to driver 17 and switch 29 as the latched input data to be programmed into the location defined by the address latched into buffer 22. Signal PE is a logic high because memory 10 is in a program mode. Signal PE is also a logic high during an erase mode. Control logic 32 controls memory 10 during the byte program mode. Control logic 32 will release control after a predetermined time if control logic 32 does not complete the desired byte program within the predetermined time. This is controlled by a timer within control logic 32.

Figure 4:
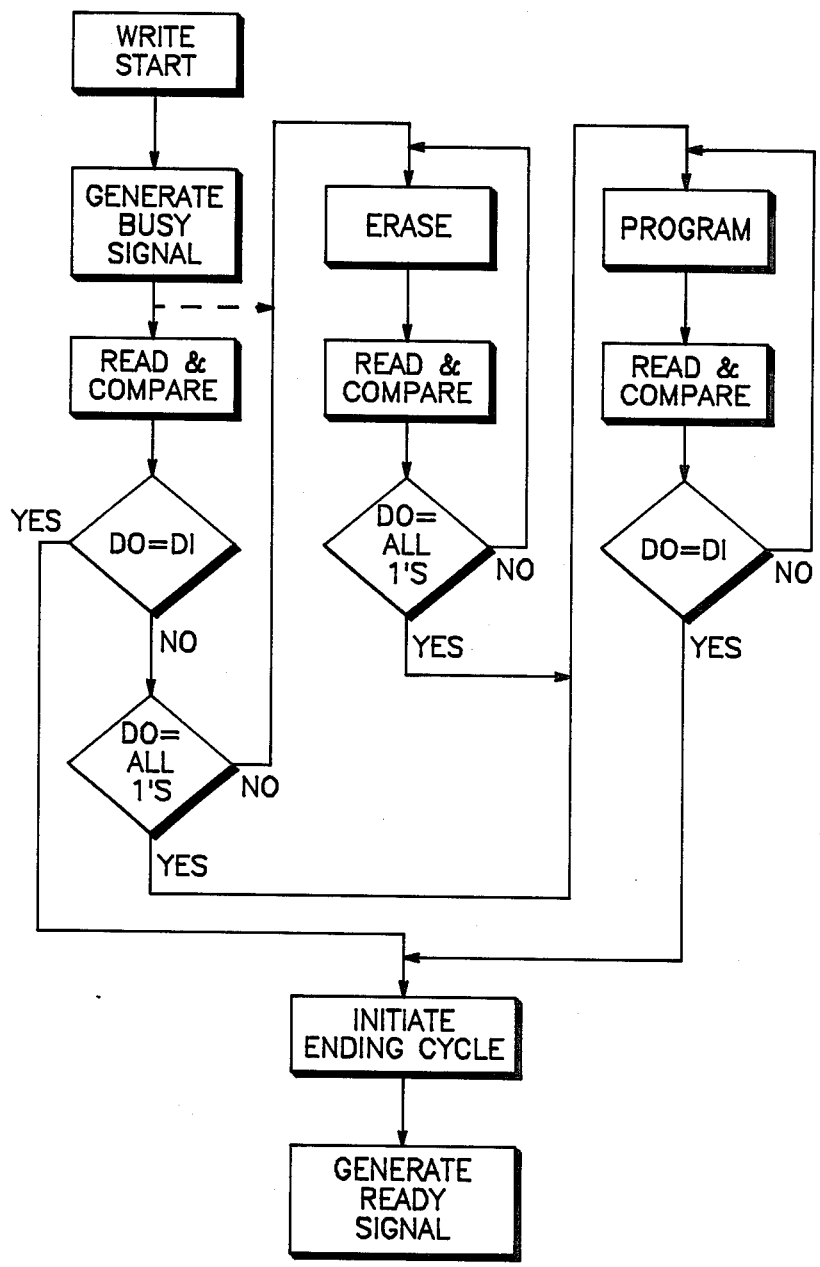
FIG. 4 is a flow diagram of the sequence implemented by the preferred embodiment of the invention.

Signals IR, PC, EC, ACE, and CC control memory 10 during the byte program mode. These signals have a unique combination of logic states for each cycle in the byte program mode. A chart shown in FIG. 3 shows the logic state for these signals for each cycle in the byte program mode. Shown in FIG. 4 is a flow diagram of the byte program mode.

After the byte write mode has been established, a program check cycle is run. In a program check cycle the data to be written, which is the new data, is compared to the data which is resident in the selected byte, which is the old data. This is achieved by performing an intelligent read and comparing the result of the intelligent read to signal DI latched in data-in buffer 18. Logic 32 instructs memory 10 to perform the intelligent read by causing signals IR, CC, and PC to be a logic high and signals EC and ACP to be a logic low. Signal PE is at a logic high during all of the byte write mode. The first step is to determine if in fact a write is necessary so signal PC is a logic high during this first step. Signal IR at a logic high indicates that a read is to be performed. Signal RC at logic low at a logic low keeps output buffer 28 disabled and further indicates that the read indicated by signal IR is an intelligent read for internal purposes. Signal PE at a logic high activates switch 29. Signal PC at a logic high causes switch 29 to couple signal DI to comparator 31. In other respects, memory 10 performs a normal read so that the data present at the location indicated by the address latched in buffer 22 is coupled to sense amplifier 27. Sense amplifier 27 provides this data as signal DO to comparator 31.

Control logic 32 provides a comparator control signal CC to comparator 31 at a logic high to cause comparator 31 to perform a comparison of the inputs thereto which are signals DI and DO. The result of this comparison is sent from comparator 31 to logic 32 by a compare output signal CO. If signal CO is a logic high, signal DI and signal DO are the same and the byte program mode is terminated by switching signals AL, DIL, and RCL to a logic low and signal READY to a logic high. In such a case, the time elapsed from signal READY switching to a logic low to signal READY switching to a logic high can easily be less than 10 microseconds. In such case very much time is saved because no redundant erase and program cycles are performed which would normally take 3 milliseconds or more. Additionally, one less erase and program cycle is subtracted from the life of the addressed byte. If comparator 31, however, provides signal CO at a logic low, the data-in is not the same as the data-out and the addressed byte will have to be programmed.

To further save time, an erase check cycle is performed to determine if an erase of the addressed location must first be performed. Because the byte at the addressed location must first be in the erased state before it can be programmed, time can be saved by not performing the erase if the byte is already in the erased state. This check is considered an erase function so logic 32 switches signal PC to a logic low to perform this check. Signals IR and CC remain at a logic high. Signal ACE remains at a logic low. With signal PC at a logic low, switch 29 provides all ones (all logic highs) to comparator 31. Comparator 31 performs a comparison of signal DO to all logic highs provided by switch 29. If comparator 31 provides signal CO at a logic high, signal DO is all logic highs. If signal DO is all logic highs, the addressed byte is in the erased state so that no erase cycle is required prior to programming. If signal CO is a logic low, the addressed byte is not in the erased state and the addressed byte must be erased.

An erase cycle is entered by signals IR, ACP, and CC switching to a logic low. With signal IR at a logic low and signal PE at a logic high, high voltage signal Vpp and signal CLP are generated. With signal EC at a logic high, signal EHV at a high voltage is coupled to the selected byte. Logic 32 includes a timer which causes signal IR to switch to a logic high to institute an erase check cycle. Signal CC is also switched back to a logic high. As in the erase check cycle which preceded the erase cycle, the contents of the addressed byte are compared to all highs. If the addressed byte is all highs, the erase has been accomplished and a program cycle commences. If the addressed byte is not all highs, the erase cycle must be repeated. The erase check cycle which precedes the first erase cycle is the same as the erase check cycle which follows an erase cycle. In either case the outcome of the all highs to DO comparison determines the same next cycle. If the comparison indicates that the byte is erased, the next cycle is a program cycle. If the comparison indicates that the byte is not erased, the next cycle is an erase cycle.

After the addressed byte has been erased, the program cycle is entered by switching signal IR to a logic low, signal PC to a logic high, signal EC to a logic low, and signal CC to a logic low. With signal PC at a logic high and signal IR at a logic low, data-in driver 17 provides signal DI at a high voltage to the addressed byte via column decoder 26. As in the case of an erase cycle, logic 32 times the program cycle. After a predetermined time of about one millisecond, logic 32 directs memory 10 to perform a program check cycle. The program check cycle is entered by switching signal IR to a logic high, signal and signal CC to a logic high. This causes a compare of the contents of the addressed byte to the data-in that was attempted to be written. This is operationally the same program check cycle that was run at the beginning of the byte program mode. For either of these two cycles, if the data-in is the same as the data-out, logic 32 terminates the byte program cycle. If the data-in is not the same as the data-out, logic 32 responds differently for these two program check cycles.

For a beginning-of-byte-write program check cycle, an erase check cycle is initiated. For a post-program program check cycle, another program cycle is initiated. After the repeated program cycle, another program check cycle is initiated to verify that the data-in is the same as the data-out. If they are not the same, yet another program cycle is initiated. This process is repeated until the data-in is the same as the data-out. When signal DO is the same as signal DI, the programming of the addressed byte has been successful and the byte program mode is terminated. This is accomplished by switching signals AL, DIL, RCL, to a logic low and signal READY/*BUSY to a logic high. Signal READY/*BUSY at logic high indicates to the user that memory 10 is responsive to the inputs thereto. The user is thus again in control of memory 10 upon signal READY/*BUSY being a logic high. Memory 10 is thus ready to change modes or perform another byte program mode as directed by the user.

The flow diagram in FIG. 4 shows the logic and operational sequence for the byte write mode. At the beginning of the cycle the READY/*BUSY signal indicates that memory 10 is busy. Next is the read and compare. If DO is the same as DI the cycle is ended. The READY/*BUSY signal then indicates that memory 10 is ready for another command. If DO is not the same as DI, a compare of DO with all 1's is performed. If DO is all 1's, a program cycle is entered. If DO is not all 1's, an erase mode is entered. After an erase cycle is completed, DO is again compared to all 1's to determine if the erase is complete. If the erase is complete, a program cycle is entered. If the erase is not complete as indicated by DO not being all 1's, an erase cycle is repeated. Erase cycles are repeated until DO is all 1's. The program cycle is similar. After a read cycle is completed, DO is compared to DI. If they are the same, the write is ended. If they are not the same, a program cycle is repeated. Program cycles are repeated until DO is the same as DI. After DI is determined to be the same as DO, the write is terminated and the READY/*BUSY signal is switched to a logic high to indicate that memory 10 is ready for another command.

In the prior art, the erase cycle was entered upon generation of the READY/*BUSY signal at a logic low. This is indicated by the dotted line in FIG. 4 showing that the time saving compares were skipped at the beginning of the byte write mode in the prior art.

I claim:

1. A memory having a write mode for programming a selected memory location according to a data input signal, comprising:

an array of memory locations, wherein a memory location is selected in response to an address, and each memory location is comprised of a set of memory cells, wherein each memory cell is in either a programmed or erased state;

programming means, coupled to the array, for programming selected ones of the memory cells of a selected memory location from an erased state to a programmed state according to the data input signal;

erasing means, coupled to the array, for erasing all of the memory cells of a selected location;

reading means, coupled to the array, for reading the state of memory cells of a selected location and providing a data output signal representative of the state of the memory cells of the selected location; and control means for performing an initial program check by comparing the data input signal to the data output signal after the write mode has been entered but prior to erasing the selected location, for providing a ready signal is the data input signal is the same as the data output signal, for causing the erase means to erase the selected memory location is the data input signal is not the same as the data output signal, and for performing an erase check by determining if all of the memory cells in the selected location are in the erased state after performing the initial program check but before performing an erase of the memory cells of the selected location.

2. The memory of claim 1 wherein the control means is further characterized as causing the programming means to program the selected memory location if the memory cells of the selected location are all erased, and as causing the erase means to erase the selected memory location if all of the memory cells of the selected location are not erased.

3. In a memory comprised of an array of memory locations in which each memory location has data present therein and is comprised of a plurality of memory cells which can be selectively programmed if all of the memory cells of the memory location are in an erased state, a write mode for programming a selected memory location with data to be written comprising the steps of:

determining if the data present in the memory location is the same as the data to be written;

terminating the write mode if the data to be written is the same as the data present in the selected memory location;

determining if the memory location is erased before erasing the memory location;

erasing the memory location if the memory location is not erased; and programming the memory location if the memory location is erased.

4. A memory having a write mode for programming a selected memory location according to a data input signal, comprising:

a memory array having intersecting erase lines and word lines with a memory location at each intersection wherein each memory location comprises a plurality of memory cells coupled to a word line and an erase line, and having a plurality of bit lines in which each memory cell is coupled to a corresponding bit line;

a row decoder for enabling a selected word line in response to a row address;

a column decoder for selecting an erase line and a corresponding plurality of bit lines in response to a column address;

a sense amplifier, coupled to the column decoder, for sensing data from selected bit lines coupled thereto by the column decoder and providing a data out signal representative of the data sensed;

a data in driver, coupled to the column decoder, for providing a write input signal, in response to the data input signal, to selected bit lines coupled thereto by the column decoder for programming a memory location corresponding to the selected bit lines and enabled word line; and control means for performing an initial program check by comparing the data input signal to the data output signal after the write mode has been entered but prior to erasing the selected location, for providing a ready signal if the data input signal is the same as the data output signal, for enabling the erase line to erase the selected memory location if the data input signal is not the same as the data output signal, and for performing an erase check by determining if all of the memory cells in the selected location are in the erased state after performing the initial program check but before performing an erase of the memory cells of the selected location.

5. The memory of claim 4 wherein the control means is further characterized as causing the data in driver to program the selected memory location is the memory cells of the selected memory location are all erased, and as enabling the erase line to erase the selected memory location if all of the memory cells of the selected memory location are not erased.

* * * * *

UNITED STATES PATENT AND TRADEMARK OFFICE
CERTIFICATE OF CORRECTION

PATENT NO. : 4,763,305
DATED : August 9, 1988
INVENTOR(S) : Clinton Kuo

It is certified that error appears in the above-identified patent and that said Letters Patent is hereby corrected as shown below:

column 9, line 35, change "is" to --if--.

column 10, line 53, change "is" to --if--.

Signed and Sealed this

Fourteenth Day of February, 1989

Attest:

DONALD J. QUIGG

*Attesting Officer*                *Commissioner of Patents and Trademarks*